(12) United States Patent
Wienchol

(10) Patent No.: US 8,514,643 B2
(45) Date of Patent: Aug. 20, 2013

(54) TEST MODE INITIALIZATION DEVICE AND METHOD

(75) Inventor: Hermann Wienchol, Richmond, TX (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 277 days.

(21) Appl. No.: 13/188,463

(22) Filed: Jul. 22, 2011

(65) Prior Publication Data

US 2013/0021863 A1 Jan. 24, 2013

(51) Int. Cl.
*G11C 7/00* (2006.01)
*G11C 29/00* (2006.01)

(52) U.S. Cl.
USPC ... 365/201; 365/96; 365/189.02; 365/189.05; 365/225.7

(58) Field of Classification Search
USPC ............... 365/201, 96, 189.02, 189.05, 225.7
See application file for complete search history.

(56) References Cited

U.S. PATENT DOCUMENTS

| 6,570,796 B2 * | 5/2003 | Sung | 365/201 |
| 7,372,752 B2 * | 5/2008 | Oh | 365/201 |
| 7,688,657 B2 * | 3/2010 | Ha | 365/201 |

* cited by examiner

*Primary Examiner* — Toan Le
(74) *Attorney, Agent, or Firm* — Winston Hsu; Scott Margo

(57) ABSTRACT

A die includes: a plurality of efuses, for respectively generating a plurality of test-mode signals; a control unit, coupled to a first control signal, for generating a plurality of control bits; a multiplexer, coupled to the plurality of test-mode signals and the control unit, for muxing the plurality of test-mode signals in series in response to the plurality of control bits; at least an address block, for receiving a specific test-mode signal; and at least a local test-mode block coupled to the address block. The local test-mode block comprises: a latch, for latching a specific test-mode signal and releasing the latched test-mode signal to the address block in response to a second control signal; a first decoder, for releasing the specific test-mode signal to the latch in response to the plurality of control bits; and a second decoder, for generating the second control signal to the latch.

12 Claims, 2 Drawing Sheets

TEST MODE INITIALIZATION DEVICE AND METHOD

BACKGROUND OF THE INVENTION

1. Field of the Invention

This invention relates to initializing of test mode functions, and more particularly, to a test mode muxing scheme that can reduce channel routing.

2. Description of the Prior Art

A primary concern of modern semiconductor devices is reducing the size of a die to achieve smaller devices. Semiconductor memories usually include a test-mode circuit. In this technology, when a memory is initialized, a test mode will be entered, which involves sending test mode signals from a variety of efuses to address blocks in order to verify that all circuits are operational. After all blocks are verified, the test mode signals and efuses are no longer needed.

Please refer to FIG. 1 which shows a conventional die circuit layout 100. The die 100 comprises a block of efuses 110 which provide a plurality of test-mode signals that are respectively routed through a plurality of decoders 121, 123, 125, 127 and latches 122, 124, 126, 128. The decoders and latches comprise a test-mode (TM) block 120, which is disposed on the die 100 close to the efuses 110. The TM block 120 then routes these latched signals to the correct individual address blocks 130, 140, 150, 160, where they will be used to test the workings of each block. As the TM block 120 is positioned relatively far from the address blocks, as shown in FIG. 1, a significant surface area of the die 100 is required for this signal routing. In some cases, the signals are routed over half the die 100, which wastes surface area that could be used for other circuitry. Furthermore, these signals are only required during power-up. As die reduction is critical in the field, a more efficient system is desired.

SUMMARY OF THE INVENTION

Therefore, it is an aim of the present invention to provide a new circuit layout that reduces the amount of space taken up by the test mode block.

A die according to an exemplary embodiment of the present invention comprises: a plurality of efuses, for respectively generating a plurality of test-mode signals during a power-up operation of the die; a control unit, coupled to a first control signal, for generating a plurality of control bits; a multiplexer, coupled to the plurality of test-mode signals and the control unit, for muxing the plurality of test-mode signals in series in response to the plurality of control bits; at least an address block, for receiving a specific test-mode signal; and at least a local test-mode block coupled to the address block. The local test-mode block comprises: a latch, coupled to the multiplexer, for latching a specific test-mode signal and releasing the latched test-mode signal to the address block in response to a second control signal; a first decoder, coupled to the plurality of control bits and the latch, for releasing the specific test-mode signal to the latch in response to the plurality of control bits; and a second decoder, coupled to the latch and an address bus for generating the second control signal to the latch.

A method for performing a test-mode operation in a die comprises: generating a plurality of test-mode signals during a power-up operation of the die; generating a series of control bits in response to a first control signal; muxing the plurality of test-mode signals in series according to the control bits; providing at least an address block; decoding and latching a specific test-mode signal at the address block according to the control bits; and releasing the specific test-mode signal to the address block according to an address signal.

These and other objectives of the present invention will no doubt become obvious to those of ordinary skill in the art after reading the following detailed description of the preferred embodiment that is illustrated in the various figures and drawings.

DETAILED DESCRIPTION

The present invention proposes a muxing scheme that diverts latching and decoding of test mode signals at the blocks, rather than at the efuses. The invention also provides a single bus line for carrying the test-mode signals, rather than a plurality of signal lines as in the prior art. This significantly reduces the amount of surface area required for the routing of signals, and allows the die size to be reduced.

Figure 1:
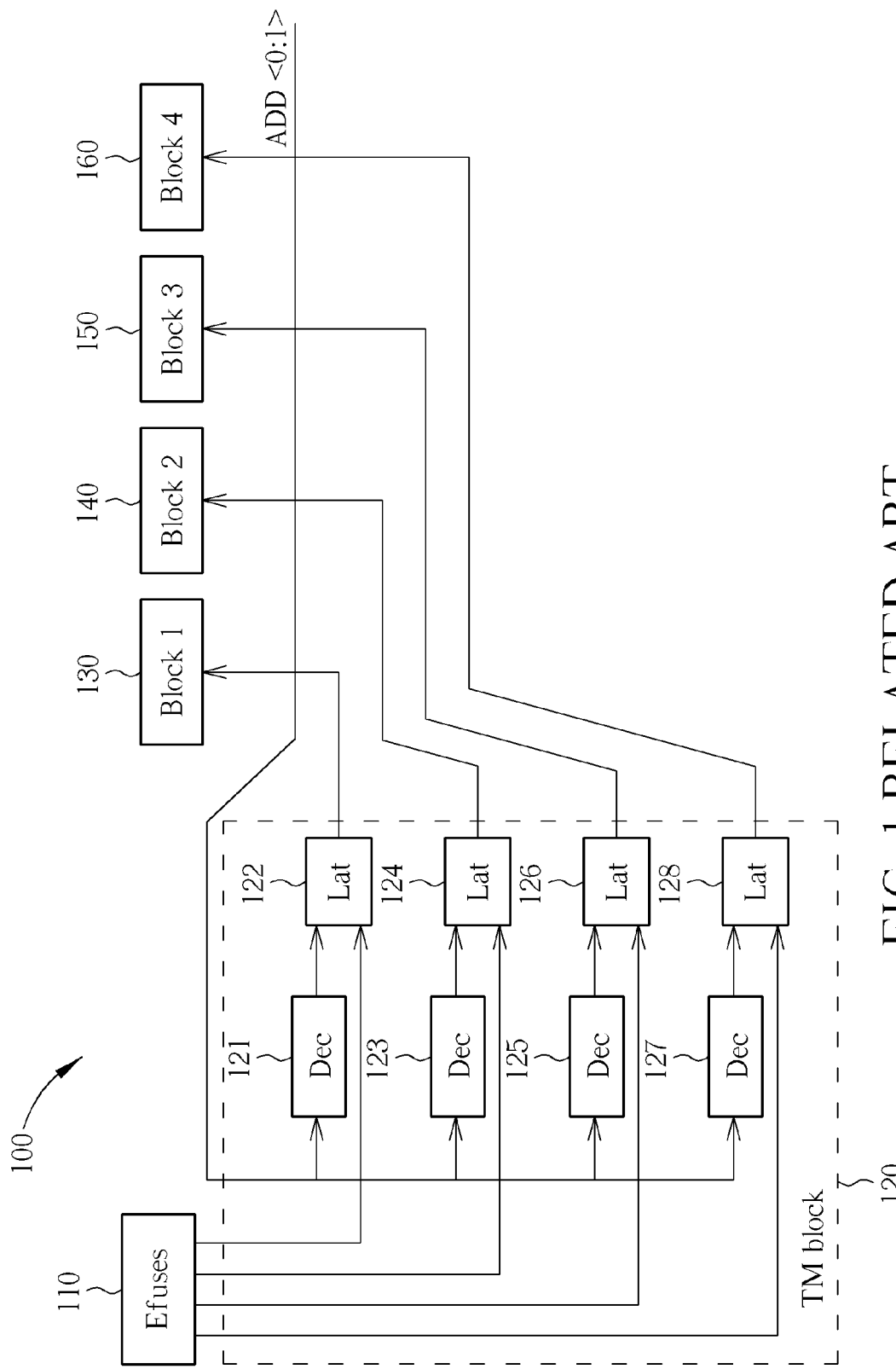
FIG. 1 is a diagram of a conventional test mode block.
Figure 2:
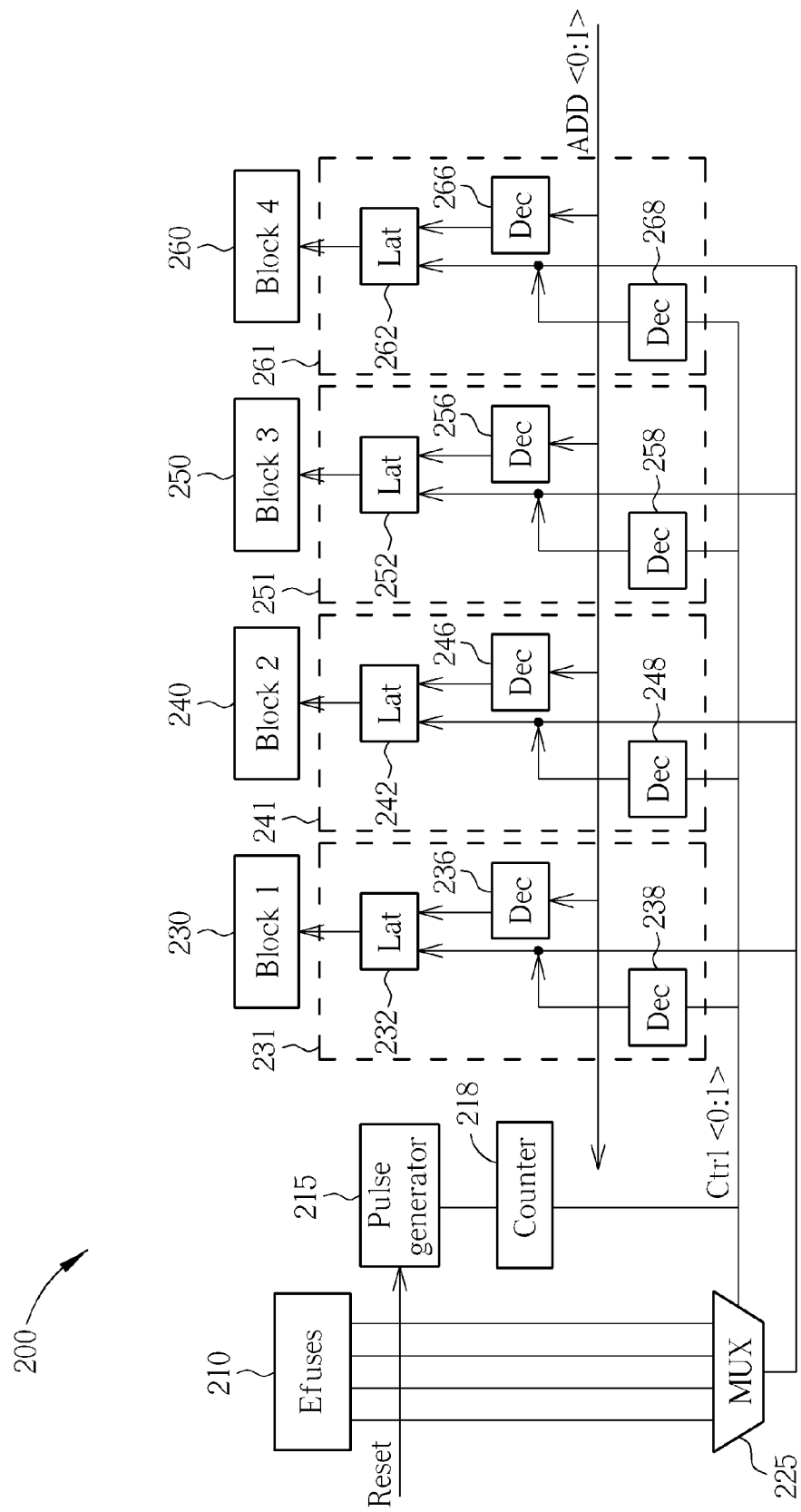
FIG. 2 is a diagram of a test mode block according to an exemplary embodiment of the present invention.

Please refer to FIG. 2, which is a diagram of a die 200 according to an exemplary embodiment of the present invention. As in FIG. 1, the die 200 comprises e-fuses 210 and a plurality of address blocks 230, 240, 250, 260. Rather than the test mode block 120 of the prior art, however, each address block has a corresponding latch (232, 242, 252, 262), a first decoder (238, 248, 258, 268) and a second decoder (236, 246, 256, 266), which are positioned locally (i.e. at the address blocks) rather than by the efuses 210. These three components can be considered as a local test-mode (TM) block (231, 241, 251, 261) of a corresponding address block. The input of the second decoders 236, 246, 256, 266 is the address bus and the input of the first decoders 238, 248, 258, 268 is a control signal. This will be detailed below.

In the system 100 shown in FIG. 1, the test-mode signals are input to the TM block 120, which is positioned on the die 100 close to the efuses 110. In FIG. 2, however, the test-mode block is replaced by local test-mode blocks 231, 241, 251, 261 and the test-mode signals are input to a multiplexer (MUX) 225. In the die 200 shown in FIG. 2, four test-mode signals are shown for simplicity, and therefore the multiplexer 225 is a 4-to-1 multiplexer; please note, however, that this is merely an example and not a limitation.

The die 200 also includes a pulse generator 215 and a counter 218, which are both coupled to a signal (a reset signal in FIG. 2). The pulse generator 215 is for generating a number of pulses, n, wherein n corresponds to the type of multiplexer; i.e. in the example shown in FIG. 2, the pulse generator 215 would generate 4 pulses. These pulses are for clocking the counter 218 to generate a series of signals each composed of a number of control bits, which are utilized to control the multiplexer 225. These signals are also input to the first decoders 238, 248, 258, 268 as the first control signal described above. The control bits input to the multiplexer 225 are utilized as the selection signal of the multiplexer 225 for controlling its output, and therefore controlling the outputting of the test-mode signals generated by the efuses 210. As illustrated in FIG. 2, the use of the multiplexer 225 allows these test-mode signals to be outputted and routed to the address blocks 230, 240, 250, 260 on a single bus, rather than the multiple signal lines shown in FIG. 1. This significantly reduces the circuit area required for the test-mode operation.

A test mode operation according to the present invention will be described with reference to FIG. 2. As is well-known, the test mode function is only required during power-up, when a reset signal will be generated for releasing all latches. Test-mode signals are sent from the efuses 210 to the latches 232, 242, 252, 262 of the test-mode blocks 231, 241, 251, 261, wherein the manner of sending the test-mode signals is controlled by the pulse generator 215 and counter 218. Therefore, the pulse generator 215 and counter 218 are ideally coupled to the reset signal such that their operation can be triggered according to an initialization procedure. Any other signal that comprises a level change, however, can be used for generating the pulses, as long as the signal is present during the power-up stage.

At the start of the test-mode operation, test-mode signals from the efuses 210 are sent to the multiplexer 225, wherein each test-mode signal has an address that can be decoded by an address bus. In the prior art, these signals were decoded by the address bus at the test-mode block 120; in the system shown in FIG. 2 the signals will be decoded locally. The use of local decoders helps reduce the amount of signal routing, by allowing all test-mode signals to be routed to the address blocks on a single bus.

At the same time as the test-mode signals being input to the multiplexer 225, the reset signal (or any other signal with a level transition) is input to the pulse generator 215 and the counter 218. The pulse generator 215 generates a number of pulses, n, corresponding to the type of multiplexer that is used. These pulses are input to the counter 218 as well as the reset signal, such that the counter 218 generates corresponding first control signals each comprising control bits. These control bits are logic signals used for the first decoders 238, 248, 258, 268 so that a correct test-mode signal can be input to the latch of a corresponding local test-mode block. For example, in the system shown in FIG. 2, there are four address blocks 230, 240, 250, 260, and therefore each signal generated by the counter should comprise two control bits: <0:0>, <0:1>, <1:0>, and <1:1>, respectively corresponding to the first test-mode signal for the first address block 230, the second test-mode signal for the second address block 240, the third test-mode signal for the third address block 250, and the fourth test-mode signal for the fourth address block 260. On the first pulse output from the pulse generator 215, the counter 218 will output <0:0>, on the second pulse output from the pulse generator 215, the counter 218 will output <0:1>, etc.

These control bits are also input to the multiplexer 225 on each pulse output from the pulse generator 215. Therefore, the 4-to-1 multiplexer 225 is instructed to mux the signals on the bus such that they are muxed in series. When the first pulse generated by the pulse generator 215 is input to the counter 218, <0:0> will be input to the multiplexer 225 such that the first test-mode signal is output, and so on. The first decoders 238, 248, 258, 268 are also coupled to the first control signal. When the multiplexer 225 receives the control signal <0:0>, it will output the first test-mode signal and the first decoder 238 will open the connection to the corresponding latch 232 such that the first test-mode signal will be latched. The same process happens for each subsequent test-mode signal so all signals can be latched at the correct location.

The address bus similarly carries logic signals/control bits that will be decoded by the second decoders 236, 246, 256, 266. When these control bits are decoded, the second decoders 236, 246, 256, 266 will input a signal to the latches 232, 242, 252, 262 according to the decoded address signals for releasing the latched test-mode signals to the corresponding address blocks 230, 240, 250, 260. The test-mode operation is thereby completed.

As detailed above, the system is not limited to a 4-to-1 multiplexer, and different multiplexers can be utilized depending on the system. The only modification required to the system is the number of control bits that are generated by the counter 218: for example, a 4-to-1 multiplexer requires 2 control bits; an 8-to-1 multiplexer requires 3 control bits, etc. As the system still only requires a single bus for transmitting all test-mode signals to corresponding address blocks, the amount of saved circuit area space is significantly increased as the number of efuses increases.

In summation, the present invention provides a system and method that routes test-mode signals in series and decodes and latches them locally at address blocks. A significant amount of circuit area is saved, allowing for the production of smaller dies.

Those skilled in the art will readily observe that numerous modifications and alterations of the device and method may be made while retaining the teachings of the invention.

What is claimed is:

1. A die for performing a test-mode operation, comprising:
   a plurality of efuses, for respectively generating a plurality of test-mode signals during a power-up operation of the die;
   a control unit, coupled to a first control signal, for generating a series of control bits;
   a multiplexer, coupled to the plurality of test-mode signals and the control unit, for muxing the plurality of test-mode signals in series according to the control bits;
   at least an address block, for receiving a specific test-mode signal; and
   at least a local test-mode block coupled to the address block, for decoding and latching the specific test-mode signal according to the control bits, and for releasing the specific test-mode signal to the address block according to an address signal.

2. The system of claim 1, wherein the local test-mode block comprises:
   a latch, coupled to the multiplexer, for latching the specific test-mode signal, and for releasing the latched test-mode signal to the address block in response to a second control signal;
   a first decoder, coupled to the control bits and the latch, for releasing the specific test-mode signal to the latch in response to the control bits; and
   a second decoder, coupled to the latch and an address bus for generating the second control signal to the latch in response to a specific address signal.

3. The system of claim 1, wherein the control unit comprises:
   a pulse generator, coupled to the first control signal, for generating a plurality of pulses; and
   a counter, coupled to the first control signal and the pulse counter, for generating the series of control bits in response to the plurality of pulses.

4. The system of claim 3, wherein the multiplexer is an x-to-1 multiplexer, the pulse generator generates x pulses and the number of control bits is determined according to x.

5. The system of claim 1, wherein the first control signal is a level transition signal.

6. The system of claim 5, wherein the level transition signal is a reset signal that is generated during the power-up operation.

7. A method for performing a test-mode operation in a die, comprising:
   generating a plurality of test-mode signals during a power-up operation of the die;
   generating a series of control bits in response to a first control signal;

muxing the plurality of test-mode signals in series according to the control bits;

providing at least an address block;

decoding and latching a specific test-mode signal at the address block according to the control bits; and releasing the specific test-mode signal to the address block according to an address signal.

8. The method of claim 7, wherein the step of releasing the specific test-mode signal to the address block according to an address signal comprises:

decoding the address signal to generate a second control signal; and releasing the specific test-mode signal in response to the second control signal.

9. The method of claim 7, wherein the step of generating a series of control bits in response to a first control signal comprises:

generating a plurality of pulses in response to the first control signal; and generating the series of control bits in response to the plurality of pulses.

10. The method of claim 9, wherein the step of muxing the plurality of test-mode signals in series according to the control bits comprises:

providing an x-to-1 multiplexer;

the step of generating a plurality of pulses in response to the first control signal comprises:

generating x pulses;

and the step of generating the series of control bits in response to the plurality of pulses comprises:

generating the series of control bits wherein the number of control bits is determined according to x.

11. The method of claim 7, wherein the first control signal is a level transition signal.

12. The method of claim 11, wherein the level transition signal is a reset signal that is generated during the power-up operation.

* * * * *